US006943428B2

(12) United States Patent
Furukawa et al.

(10) Patent No.: US 6,943,428 B2
(45) Date of Patent: Sep. 13, 2005

(54) SEMICONDUCTOR DEVICE INCLUDING BIPOLAR TRANSISTOR AND BURIED CONDUCTIVE REGION

(75) Inventors: Taisuke Furukawa, Hyogo (JP); Yoshikazu Yoneda, Hyogo (JP); Tatsuhiko Ikeda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/229,138

(22) Filed: Aug. 28, 2002

(65) Prior Publication Data

US 2003/0160301 A1 Aug. 28, 2003

(30) Foreign Application Priority Data

Feb. 26, 2002 (JP) ........................................ 2002-049750

(51) Int. Cl.[7] ................... H01L 27/082; H01L 27/102; H01L 29/70; H01L 31/11
(52) U.S. Cl. .................. 257/587; 257/590; 438/348
(58) Field of Search .................. 257/565, 566, 257/567, 568, 569, 570, 571, 572, 573, 574, 575, 576, 577, 578, 355, 356, 357, 358, 359, 360, 361, 362, 363, 364, 365, 170; 438/348

(56) References Cited

U.S. PATENT DOCUMENTS

| 4,542,580 | A | * | 9/1985 | Delivorias .................... 29/590 |
| 4,826,780 | A | * | 5/1989 | Takemoto et al. ............. 437/37 |
| 5,083,180 | A | * | 1/1992 | Miura et al. .................. 357/43 |
| 5,559,349 | A |   | 9/1996 | Cricchi et al. |
| 5,714,902 | A | * | 2/1998 | Comer ........................ 327/346 |
| 6,118,172 | A |   | 9/2000 | Yamawaki et al. |
| 6,146,957 | A | * | 11/2000 | Yamasaki .................... 438/326 |
| 6,441,462 | B1 | * | 8/2002 | Lanzerotti et al. .......... 257/576 |

FOREIGN PATENT DOCUMENTS

| JP | 1-302743 | 12/1989 |
| JP | 9-74102 | 3/1997 |

OTHER PUBLICATIONS

Nakashima, Takashi et al., "0.8 $\mu$m BiCMOS Process with High Resistivity Substrate for L–Band Si–MMIC Applications", IEEE BCTM 8.3 (1996), pp. 134–137.

* cited by examiner

*Primary Examiner*—B. William Baumeister
*Assistant Examiner*—Dana Farahani
(74) *Attorney, Agent, or Firm*—Leydig, Voit & Mayer, Ltd.

(57) ABSTRACT

A semiconductor device and a method for manufacturing the device using a semiconductor substrate of a high resistance with improved Q value of a passive circuit element. Leakage current due to an impurity fluctuation, in the high resistance semiconductor substrate and noise resistance of an active element in the high resistance semiconductor substrate are improved. The semiconductor device includes a bipolar transistor at a main surface of and in the semiconductor substrate. The bipolar transistor includes a semiconductor layer of a first conductivity type at a bottom portion of the bipolar transistor and the semiconductor device includes a buried layer of a second conductivity type, located in the semiconductor substrate and facing the semiconductor layer of the first conductivity type.

13 Claims, 16 Drawing Sheets

SEMICONDUCTOR DEVICE INCLUDING BIPOLAR TRANSISTOR AND BURIED CONDUCTIVE REGION

BACKGROUND OF THE INVENTION

1. Field of the Invention

The present invention relates to a semiconductor device and a method for manufacturing the same, and more particularly to a semiconductor device wherein a silicon substrate of a high resistance is used to secure the Q value of passive elements and to restrict leakage current to the substrate so that noise between elements can be reduced, and a method for manufacturing the same.

2. Description of the Background Art

As mobile terminal apparatuses, such as cellular phones, have come into wide use, the manufacture of high frequency devices at a lower cost has become required. Therefore, research has been carried out concerning the replacement of MMICs (Monolithic Microwave Integrated Circuits), wherein the expensive compound semiconductor GaAs is used, with MMICs or Bi-CMOSs (Complementary Metal Oxide Semiconductor) that use silicon (Si) as a base.

Si into which n conductive type or p conductive type impurities are doped is used as a substrate in a Bi-CMOS wherein a conventional Si substrate is used. Such Si is known as having a large dielectric loss in comparison with GaAs (see, for example, Japanese Patent Laying-Open No. 9-74102). That is to say, in the case that an Si substrate is used, a dielectric loss occurs between the Si substrate and a collector epitaxial layer in passive elements, such as inductors or capacitors, in transmission lines or in pad portions. Therefore, it is difficult to form capacitors or inductors having Q values that are sufficiently large in high frequency regions by using an Si substrate.

There has been a proposal that the utilization of a wafer having a high electrical resistance is effective in order to lower the dielectric loss that occurs in the above described Si semiconductor element (Abstract of IEEE BCTM (1996) pp. 134–137: "0.8 µm BiCMOS Process with High Resistivity Substrate for L-Band Si-MMIC Applications"). In addition, the above described Japanese Patent Laying-Open No. 9-74102 discloses an example of a high frequency circuit wherein a high resistance substrate is used. As illustrated in these, when a high resistance substrate is used it becomes possible to raise the Q value of the above described passive elements and, therefore, this is advantageous to form a high frequency circuit.

In the case that a high resistance substrate, as described above, is used, however, the following problems arise.

(1) Due to the low impurity concentration in a high resistance substrate there is a possibility that the impurity concentration will fluctuate and the conductivity type will change (a1) in the case that the impurity amount included in the substrate fluctuates slightly in the manufacturing process of this high resistance substrate, (a2) in the case that this high resistance substrate is contaminated with a substance that becomes an impurity during the process for forming elements in the high resistance substrate or (a3) in the case that the temperature or the atmosphere of a heat treatment fluctuate slightly during the process for forming elements in the high resistance substrate. Therefore, there is a risk that leakage current will increase from a collector region to the substrate in an element due to unexpected fluctuation in impurities and, thereby, the yield of the elements is lowered.

(2) There are p type or n type regions directly beneath the elements in a low resistance substrate so that a shield effect due to these conductive regions can be expected. However, the amount of dopant included in the crystal is small in a high resistance substrate and, therefore, the effect of the shielding of electromagnetic waves by means of the substrate is lowered. Therefore, the spread of electric flux lines from the elements becomes great in the lateral direction and there is a problem that the influence of noise between elements will becomes large when active elements are integrated at a high density.

SUMMARY OF THE INVENTION

An object of the present invention is to provide a semiconductor device and a manufacturing method for the same wherein a semiconductor substrate of a high resistance is used so that the Q value of the passive circuit elements can be enhanced, wherein leak current due to impurity fluctuation that easily occurs in such a high resistance semiconductor substrate is restricted and wherein noise resistance of active elements in the high resistance semiconductor substrate is increased.

A semiconductor device of the present invention is a semiconductor device that includes a bipolar transistor formed in the main surface of a semiconductor substrate. The bipolar transistor of this semiconductor device includes a semiconductor layer of a first conductive type at the bottom portion thereof and this semiconductor device is provided with a buried layer of a second conductive type located in the semiconductor substrate, wherein a portion of the semiconductor substrate is interposed between the semiconductor layer of the first conductive type of this bipolar transistor and the buried layer of the second conductive type.

According to this configuration, a barrier potential against carriers can be formed by providing a predetermined potential to the buried layer of the second conductive type in the case that the above described first conductive layer is use as, for example, a buried collector region or a buried base region. Therefore, even in the case that, for example, a semiconductor substrate of a high resistance, of which the impurity concentration is very low, is used and an impurity concentration fluctuates so that the conductive type fluctuates in the process of manufacture of a semiconductor device, such a barrier potential can prevent leak current from leaking from this buried collector region or this buried base region to the substrate.

In the case that a high resistance substrate is not used and, for example, the semiconductor substrate has a low resistance so that the amount of leak current is great, leak current can be suppressed without fail by providing the above described barrier potential.

In addition, a predetermined potential can be provided to the above described buried layer of the second conductive type from the outside as the above described barrier potential. In the case that an active element is provided in addition to the above described bipolar transistor, the electric flux lines of the transistor can be confined in a narrow range by this potential. As a result of this, noise resistance of the semiconductor device can be increased. In the case that a high resistance semiconductor substrate is not used, such noise resistance can be expected to a certain degree and the noise resistance can be further increased by the above described buried layer of the second conductive type.

A semiconductor device of the present invention includes a bipolar transistor provided in a semiconductor substrate. This bipolar transistor has a first semiconductor layer of a first conductive type located in the semiconductor substrate, an insulating film located above the first semiconductor layer and having an opening above the first semiconductor layer, a second semiconductor layer of a second conductive type located above the first semiconductor layer and contacting the first semiconductor layer in the opening and a third semiconductor layer of the first conductive type located above the second semiconductor layer and contacting the second semiconductor layer in the opening. Furthermore, a buried conductive layer of the second conductive type located in the semiconductor substrate is provided, wherein a portion of the semiconductor substrate is interposed between the first semiconductor layer of the bipolar transistor and the second semiconductor layer.

According to this configuration, in the case that a vertical bipolar transistor, for example, is formed including the first to the third semiconductor layers wherein the first semiconductor layer is used as a collector region, leak current from the collector region can be prevented by providing a potential that becomes a barrier potential to the buried layer of the second conductive type. In addition, in the case that an active element is included in addition to the above described bipolar transistor, the electric flux lines of the above described bipolar transistor can be confined in a narrow range so that noise resistance can be increased.

A manufacturing method for a semiconductor device of the present invention is provided with the steps of: preparing a semiconductor substrate having a specific resistance of no less than 100 Ωcm; forming a buried conductive layer of a second conductive type in the semiconductor substrate; and forming a lower portion layer of a first conductive type in the semiconductor substrate near to the surface above the buried conductive layer, wherein a portion of the semiconductor substrate is interposed between the buried conductive layer and the lower portion layer of the first conductive type. In addition, the manufacturing method is provided with the steps of: forming an epitaxial layer of the first conductive type above the lower portion layer of the first conductive type; and forming an element isolation insulating film having an opening above the epitaxial layer of the first conductive type. Furthermore, the manufacturing method is provided with the steps of: forming a region of the second conductive type above the epitaxial layer of the first conductive type so as to contact the epitaxial layer of the first conductive type in the opening of the element isolation insulating film; and forming an upper portion region of the first conductive type above the region of the second conductive type so as to contact the region of the second conductive type.

According to this method, a predetermined potential is supplied to the buried layer of the second conductive type and, thereby, leak current can be prevented from leaking from the lower portion region of the first conductive type of the bipolar transistor to the semiconductor substrate even in the case that the conductive type or the like, fluctuates during the process due to the very low impurity concentration of the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Next, embodiments of the present invention will be described in reference to the drawings.

(First Embodiment)

Figure 1:
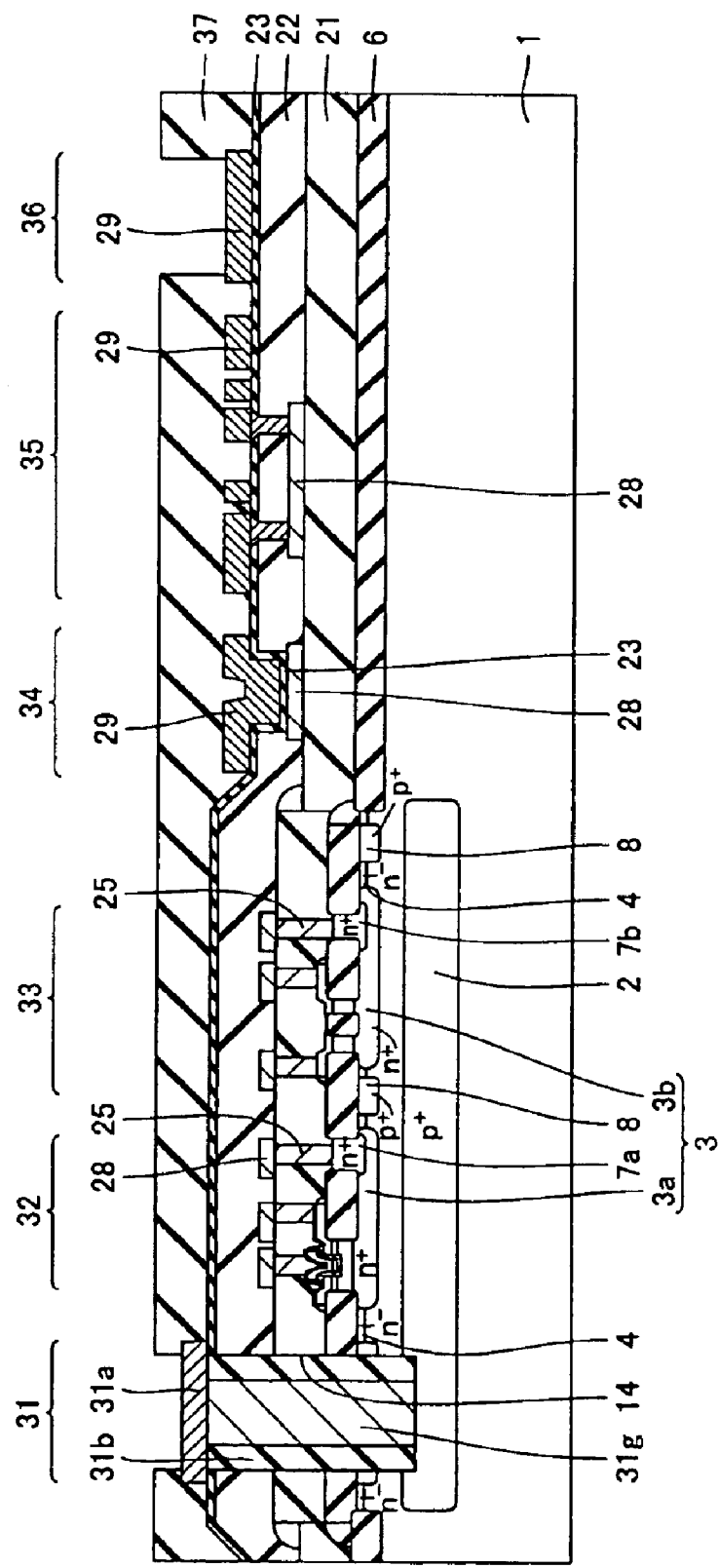
FIG. 1 is a cross sectional view showing a configuration of a semiconductor device according to a first embodiment of the present invention.

In FIG. 1, a buried layer 2 of a p conductive type is placed in an Si substrate 1 having a specific resistance of no less than 100 Ωcm and a vertical npn transistor 32 and a horizontal pnp transistor 33, which are active elements, are provided above this buried layer 2 of the p conductive type. A leading electrode 31 is electrically connected to buried layer 2 of the p conductive type and an electrode portion 31a of the leading electrode is placed on a plug wire 31g so as to be exposed from the upper surface of the semiconductor device. Plug wire 31g of this leading electrode is provided in an opening 14 that penetrates interlayer insulating films 21 and 22 and an epitaxial growth layer 3 located there beneath and reaches to buried layer 2 of the p conductive type. The sidewalls of this opening 14 are covered with an oxide film 31b and a Ti film, a TiN film or an Al film forming leading electrode terminal 31a is provided above oxide film 31b.

A collector leading electrode 7a is electrically connected to a buried collector region 3a formed of an epitaxial layer 3 of an n+ conductive type in vertical npn transistor 32. A base region and an emitter region are placed, in this order, above collector region 3a.

A base leading electrode 7b is electrically connected to a buried base region 3b formed of epitaxial layer 3 of the n+ conductive type in horizontal pnp transistor 33. An emitter region and a collector region are placed above both sides of base region 3b.

The above described semiconductor substrate may have a specific resistance of no less than 100 Ωcm. By enhancing the resistance of the semiconductor substrate, eddy current loss can be reduced, as described above, so that the Q value of a passive circuit element can be increased. In order to obtain a higher Q value, it is desirable for the specific resistance of the semiconductor substrate to be no less than 300 Ωcm and, in addition, no less than 500 Ωcm. A silicon substrate of such a high resistance can be manufactured by adding almost no impurities, or only a slight amount of impurities, to silicon at the time when a silicon ingot is prepared by using a CZ (CZochralski) method, an FZ (Floating Zone) method or an MCZ (Magnet CZochralski) method.

The above described transistors are both formed in the openings of an element isolation insulating film 6 formed so as to cover the Si substrate. A first interlayer insulating film 21 and a second interlayer insulating film 22 are deposited above element isolation insulating film 6, in this order, from beneath.

The above described collector leading electrode 7a of vertical npn transistor 32 and base leading electrode 7b of horizontal pnp transistor 33, respectively, are electrically connected to plug wires 25 and, then, to wires 28. An element isolation region 8 of a p+ conductive type is arranged around horizontal pnp transistor 33 and vertical npn transistor 32 beneath the surface layer of the Si substrate for electrically isolating these elements.

On the other hand, buried layer 2 of the p conductive type and n− epitaxial layer 4 are not placed beneath an MIM (Metal Insulator Metal) capacitor 34, an inductor 35 and a pad 36, which are passive circuit elements.

The semiconductor device according to this example may have a passive circuit element in an area different from the area wherein the bipolar transistor is located in the main surface of the semiconductor substrate so that the buried layer of the second conductive type is not located beneath the passive circuit element. In the case that the buried layer of the second conductive type is located beneath the passive circuit element, eddy current loss due to high frequency electric waves occurs in the buried layer of the second conductive type so that the semiconductor device functions as if there is an apparent resistance R. Therefore, the Q value of an inductor or of a capacitor can only be resonant with a low peak having a broad width because of resistance R. As described above, the semiconductor device is arranged so that the buried layer of the second conductive type is not located beneath the passive circuit element and, thereby, the above described apparent resistance R can be reduced so that the Q value can be enhanced.

MIM capacitor 34 is formed of a lower electrode layer 28, a dielectric layer (insulating layer) 23 and an upper electrode layer 29 in an opening 27 provided in second interlayer insulating film 22. In addition, inductor 35 is formed of wire layers 28 and 29. The active elements and the passive circuit elements are covered with a passivation film 37 while only a pad 36 is provided with an opening so that electrode terminal layer 29 is exposed.

Next, a manufacturing method for the semiconductor device shown in FIG. 1 will be described. First, a buried collector layer 3 of an n conductive type is formed by implanting Sb into an Si substrate 1 having a specific resistance of 100 Ωcm, or more (see FIG. 2). Next, an oxide film 5 having a thickness of 0.7 $\mu$m is formed by means of chemical vapor deposition method (CVD method). After this, a resist pattern is formed by means of a photomechanical process and regions wherein transistors are formed are selectively etched by using buffer fluoric acid so that openings are provided.

Furthermore, after implanting 1E14 cm$^{-2}$ of B$^+$ ions at, for example, 1 MeV, the resist pattern is peeled off. Furthermore, a heat treatment at 1000° C. is carried out so as to form a buried conductive layer 2 of a p conductive type and, then, after removing a damaged layer of the surface by 30 nm through thermal oxidation, the oxide film 5 is etched away. After this, an epitaxial silicon layer 4 of the n conductive type of 0.5 $\mu$m wherein phosphorus is doped to approximately 1E17 cm$^{-3}$ is formed by means of a selective epitaxial method. This epitaxial silicon layer 4 of the n conductive type becomes a collector region connected to a buried collector region 3a in a vertical npn transistor 32 and becomes a base region connected to a buried base region 3b in a horizontal pnp transistor 33.

The following description is limited to a manufacturing method for vertical npn transistor 32 unless otherwise stated.

Figure 3:
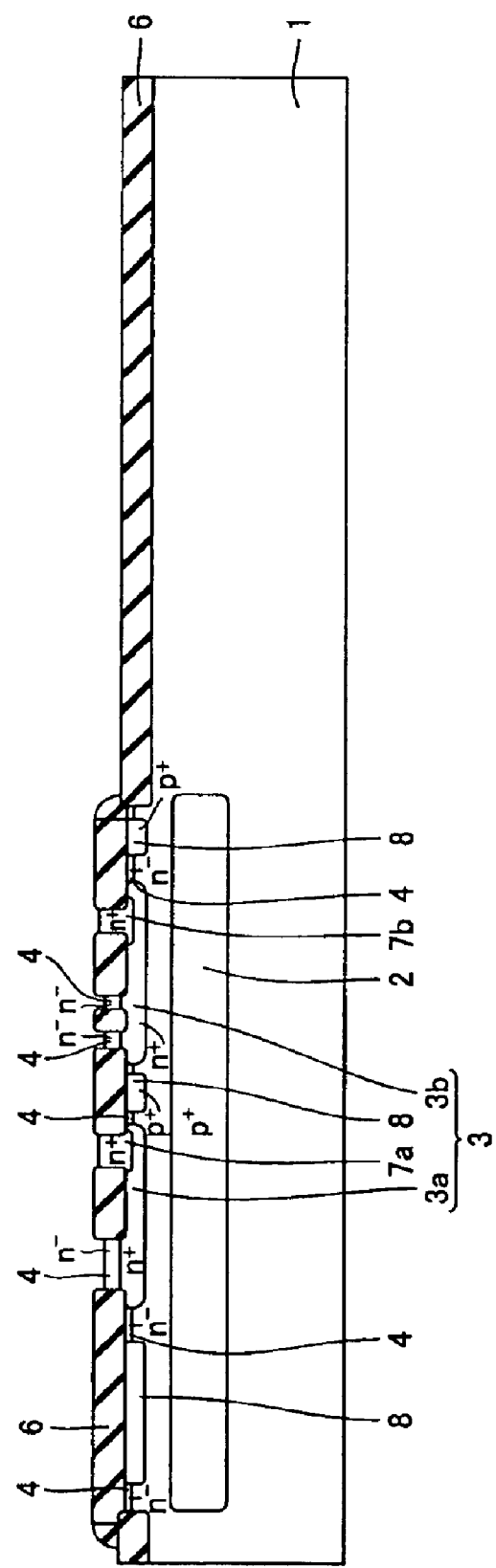
FIG. 3 is a cross sectional view of a stage wherein an element isolation insulating film has been formed and impurity elements have been implanted in the respective portions after the stage of FIG. 2.

After this, the oxide film is removed and, then, an element isolation insulating film 6 is formed by means of a LOCOS (Local Oxidation of Silicon) method (see FIG. 3). Phosphorus is implanted into a portion in which a collector leading electrode is to be formed so that a layer 7a of an n+ conductive type is formed. Then, boron is implanted in the element isolation region so that a layer 8 of a p+ conductive type is formed. Then, after a thermal oxide film of approximately 30 nm is formed, etching is carried out selectively so that an oxide film is formed in a region where the collector leading electrode is to be formed.

Figure 4:
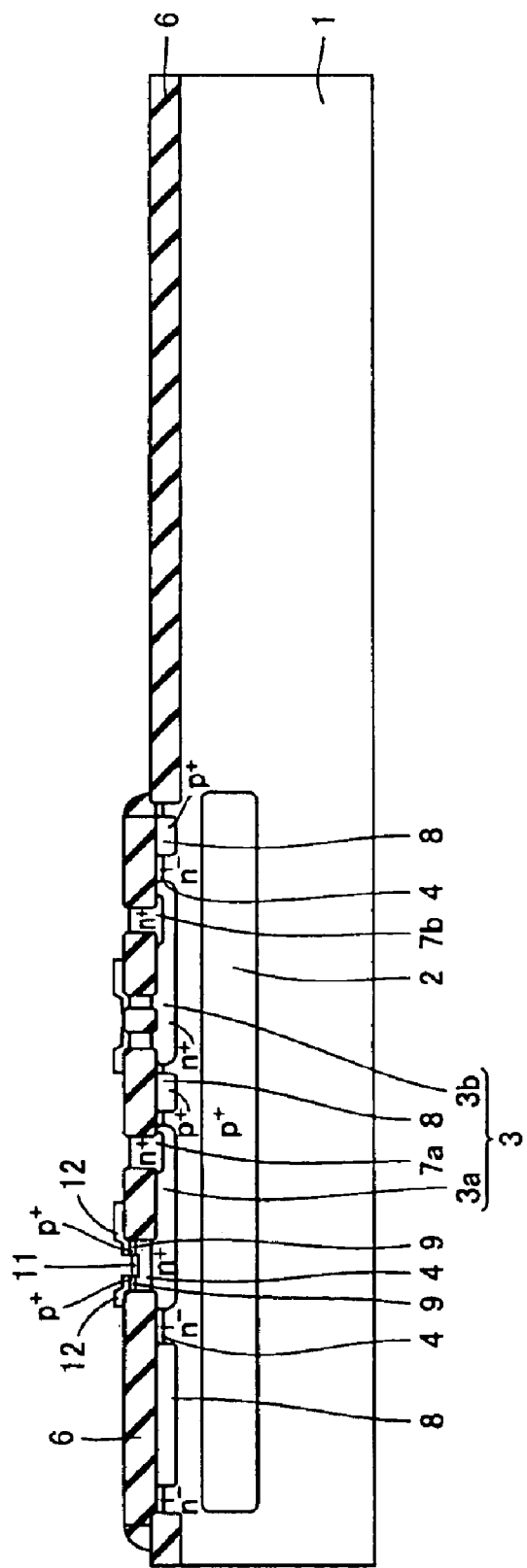
FIG. 4 is a cross sectional view of a stage wherein an intrinsic base, and the like, of a vertical npn bipolar transistor has been formed.

Next, a polycrystal silicon (polysilicon) and an oxide film are deposited on the entirety of the surface and, therefore, boron is implanted to a high concentration (see FIG. 4). Next, etching is carried out selectively so as to open an emitter region and boron is implanted into this emitter opening so that an intrinsic base region 11 of a p+ conductive type is formed. After this, after an oxide film spacer (not shown) is formed, a diffusion layer 9 of a p conductive type is formed by means of a heat treatment. Furthermore, a base electrode 12 is formed.

Figure 5:
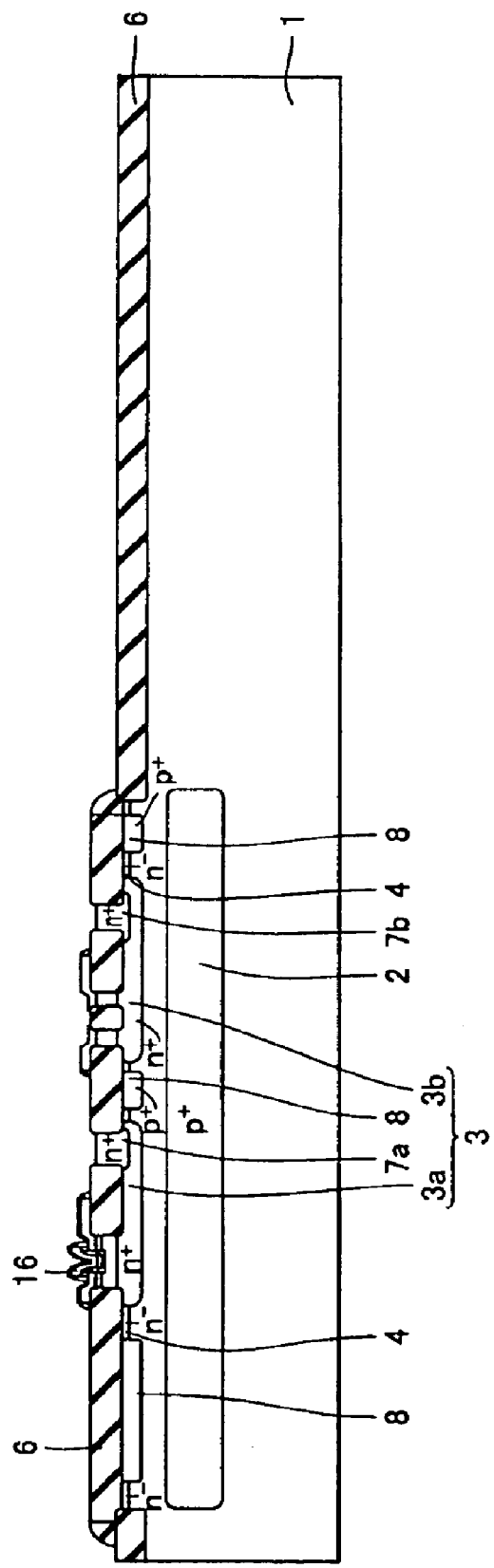
FIG. 5 is a cross sectional view of a stage wherein an emitter electrode of the vertical npn bipolar transistor has been formed.
Figure 6:
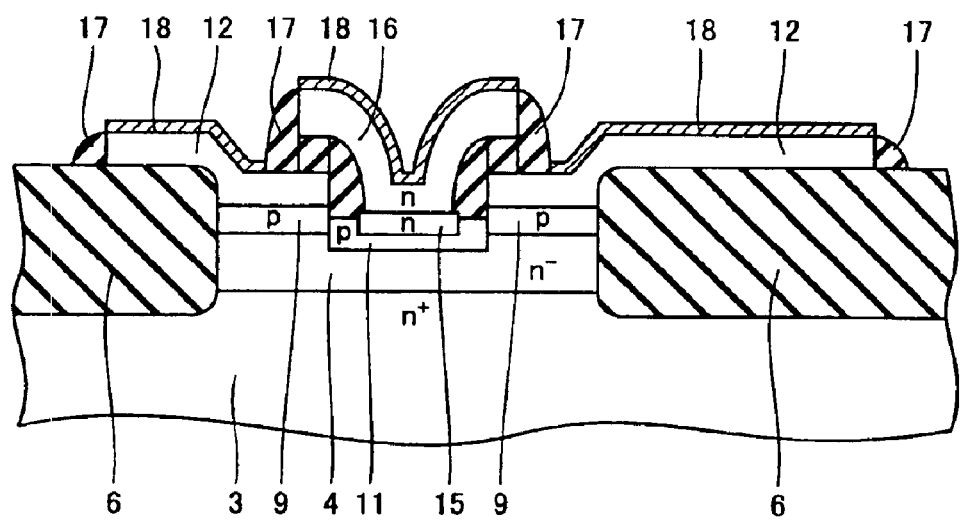
FIG. 6 is a cross sectional view showing the vertical npn bipolar transistor.

After this, an emitter region is formed on the base. First, polysilicon is deposited, ion implantation of arsenic is carried out and, moreover, the polysilicon electrode is etched so that an emitter electrode 16 is formed (see FIG. 5). In reference to FIG. 6, after this, annealing is carried out and, thereby, a diffusion layer 15 of an n conductive type that becomes the emitter region is formed. A spacer 17 is formed on this emitter electrode and a cobalt silicide film 18 is formed above the emitter and the external base.

Figure 7:
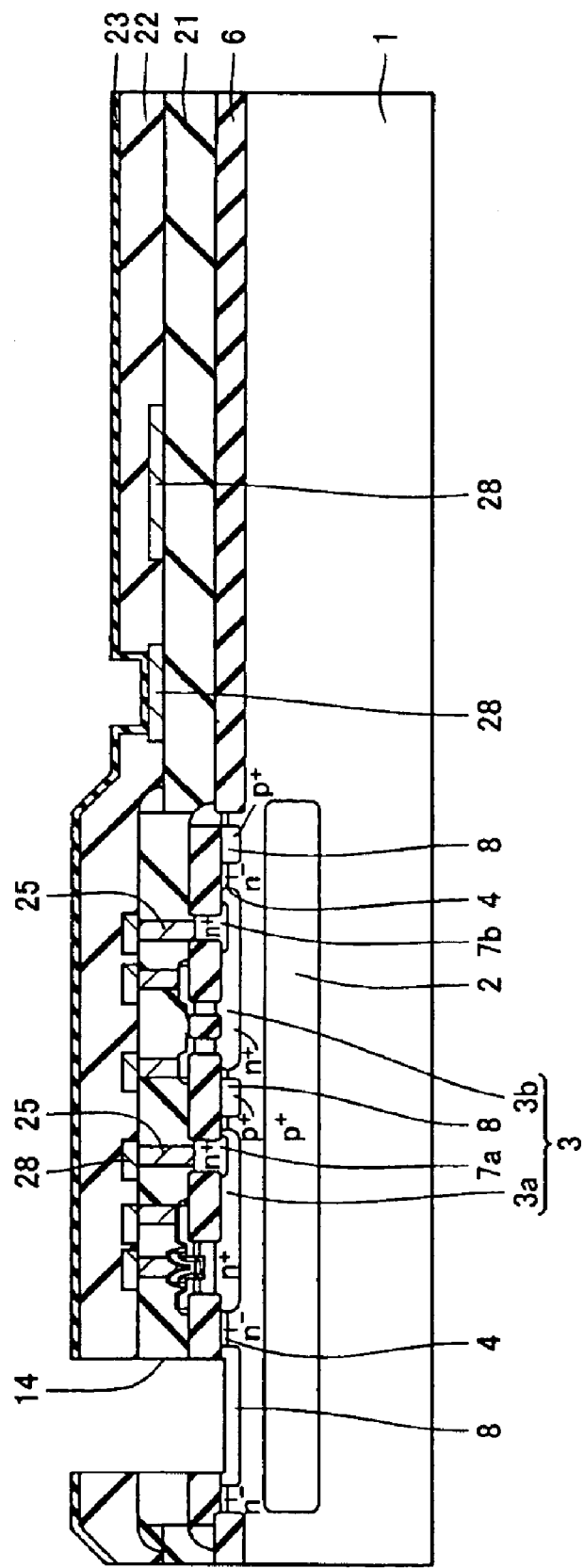
FIG. 7 is a cross sectional view of a stage wherein a dielectric film has been formed in which an opening for forming a leading electrode of a buried conductive layer is provided.

In the above description, the formation of a horizontal pnp transistor is carried out in parallel with the formation of the vertical npn transistor or before or after the formation of the vertical npn transistor. After this, a first interlayer insulating film 21 that covers these transistors is deposited (see FIG. 7). Contact holes are opened in this first interlayer insulating film and conductive layers are filled in within these contact holes so that contact plugs 25 are formed. Next, AlCu wires 28 are formed on the first interlayer insulating film. These AlCu wires 28 are formed so as to be electrically connected to the above described contact plugs 25 in regions of the above described two transistors.

Next, a second interlayer insulating film 22 is deposited so as to cover the entirety of the element and an opening 27 reaching to an AlCu wire 28 is provided in a region wherein an MIM capacitor is formed and, moreover, an oxide film 23 that becomes a capacitor dielectric film is deposited. Next, an opening reaching substrate 1 is provided in a position wherein a leading electrode of buried conductive layer 2 is formed. Furthermore, the substrate is etched so that an opening 14 is provided so as to continue to the above described opening and to reach to the buried conductive layer. Next, an oxide film is deposited and etched back and, thereby, an insulating layer 31b is formed.

Next, an opening is provided in the second interlayer insulating film so as to reach to the first AlCu wire and an AlCu wire 29, which becomes an electrode located above second interlayer insulating film 22, is provided so as to fill in the opening and, simultaneously, 31g is formed (see FIG. 1). Furthermore, a passivation film 37 is deposited. After this, a pad portion 36 is etched and the semiconductor integrated circuit is completed.

Figure 2:
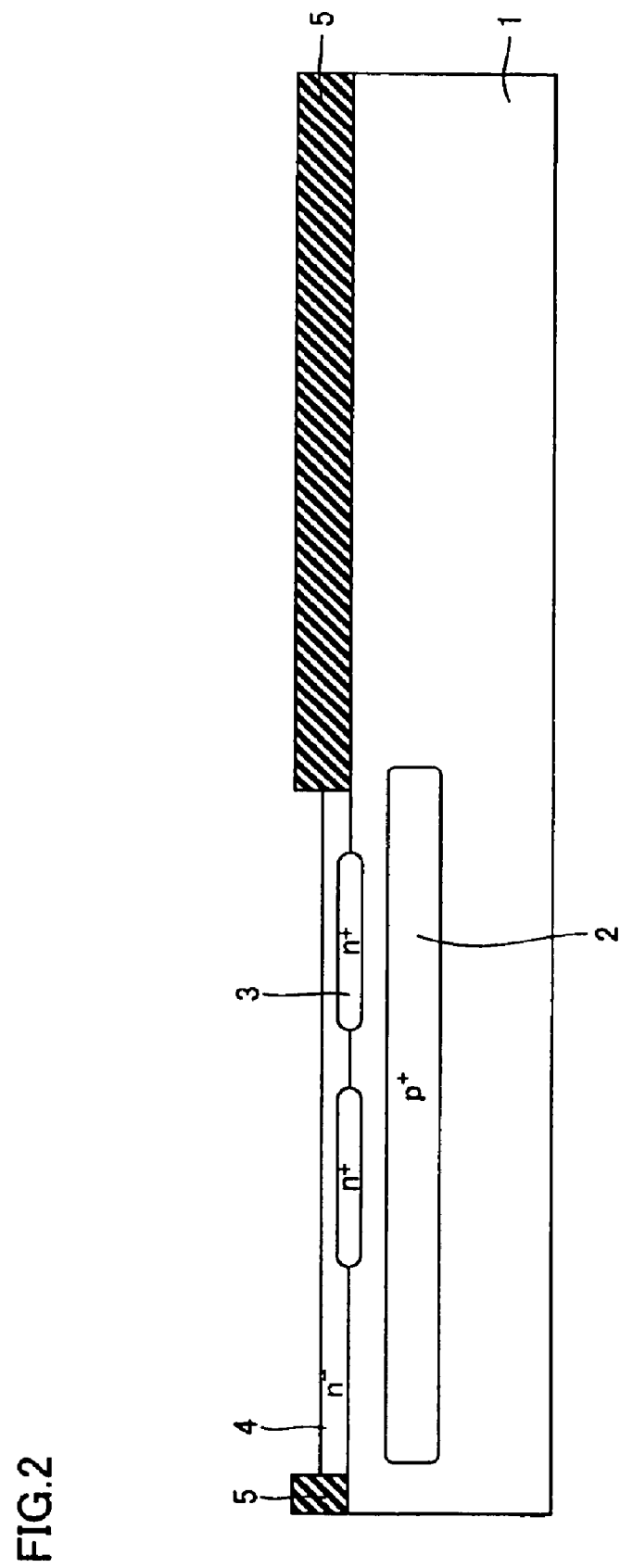
FIG. 2 is a cross sectional view of a stage wherein an n-type epitaxial layer has been formed during manufacture of the semiconductor device of FIG. 1.

Though in the above description of the manufacturing method, an example wherein semiconductor layer 4 of the n– conductive type is formed by means of selective epitaxial growth is shown in FIG. 2, a semiconductor layer of the n– conductive type may be made to grow over the entirety of the surface and, then, only the desired portions are etched so as to be removed and, thereby, semiconductor layer 4 of the n– conductive type may be formed.

In addition, as described in the second embodiment, the npn transistor may be formed as a hetero bipolar transistor (HBT) wherein SiGe is used as a base.

According to the present embodiment, a high barrier potential against carriers can be provided to the buried layer of the p conductive type located beneath the collector region of the n conductive type. Therefore, leak current can be restricted from flowing from the collector to the substrate even (c1) in the case that the conductive type of the high resistance substrate fluctuates during the manufacturing process of the high resistance substrate, (c2) in the case that the conductive type of the high resistance substrate is contaminated by impurities (dopants), or the like, during the process of forming an element in the high resistance substrate or (c3) in the case that the conductive type of the high resistance substrate fluctuates due to the dispersion of the heat treatment conditions.

In addition, the potential of the buried conductive layer is fixed and, thereby, the electric lines of force of the transistors can be confined in a smaller range so that the noise resistance of the element can be increased. Furthermore, the Q value of the passive elements can be prevented from deteriorating due to the effects of the reception from the buried conductive layer and noise resistance of the bipolar transistors can be increased.

In the case of an SiGe-HBT that operates at a high speed, noise resistance becomes higher and loss can be reduced in the high resistance substrate. As described in the following, in the case of the SiGe-HBT, the buried conductive layer can be formed by means of epitaxial growth.

This semiconductor device according to this example may be provided with another bipolar transistor in the semiconductor substrate in addition to the above described bipolar transistor so that this additional bipolar transistor also has a semiconductor layer of the first conductive type at a bottom portion and so that the buried layer of the second conductive type extends so as to face the semiconductor layer of the first conductive type of this additional bipolar transistor.

Leak current that can occur due to the fluctuation of the conductive type of the semiconductor substrate having an extremely low impurity concentration caused by contamination, or the like, during manufacture can be prevented over a broader region. In addition, the range of active elements having noise resistance can be enlarged.

(Second Embodiment)

A base is formed of SiGe in the semiconductor device according to the second embodiment of the present invention. The configuration of this semiconductor device is the same as in the semiconductor device shown in FIG. 1. The semiconductor device according to the present embodiment is characterized by the point that the base is formed of SiGe and it is easier to understand the characteristics of this device by beginning the description from the manufacturing method.

Figure 8:
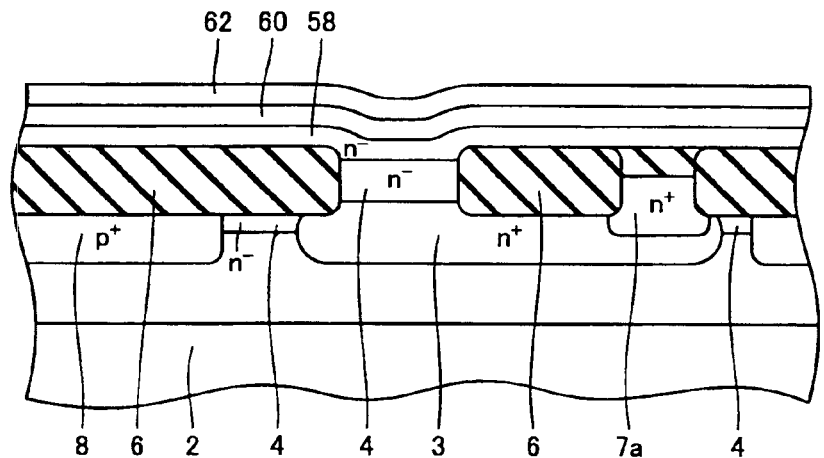
FIG. 8 is a cross sectional view showing a stage wherein a collector upper layer, a base layer and an emitter layer are formed in sequence according to a manufacturing method for a vertical HBT arranged in a semiconductor device of a second embodiment of the present invention.

The manufacturing method of the semiconductor device according to the present embodiment is the same as in the first embodiment up to the step of FIG. 3. Next, as shown in FIG. 8, an Si epitaxial layer 58, an SiGe epitaxial layer 60 and an Si epitaxial layer 62 are made to sequentially grow from below in this order so as to cover the entirety of the wafer. At this time, an Si film or an SiGe film grows as a polycrystal film above an element isolation insulating film 6. Si epitaxial film 58 forms a collector region with n– epitaxial layer 4, which is the lower layer, while SiGe epitaxial layer 60 becomes a base region and Si epitaxial layer 62 becomes an emitter region.

Figure 9:
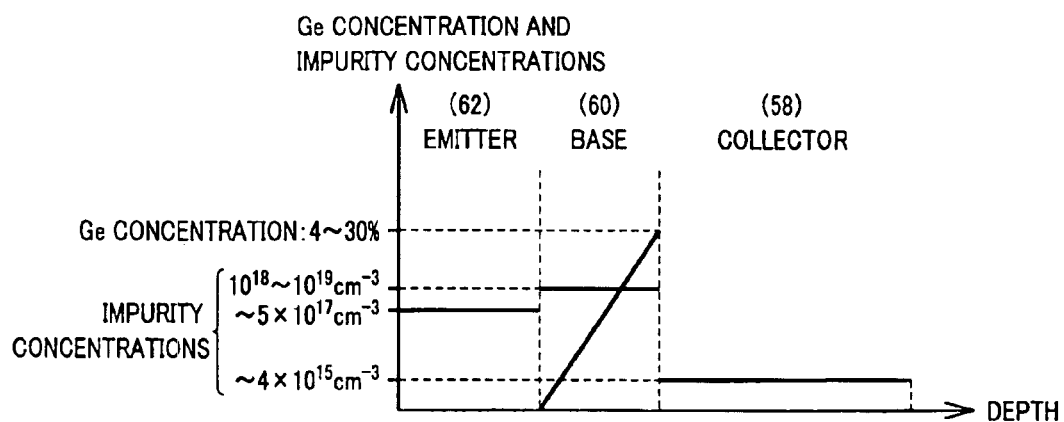
FIG. 9 is a graph showing profiles of the Ge concentration and the impurity concentrations in the base layer of the vertical HBT (Heterojunction Bipolar Transistor) of FIG. 8.

FIG. 9 is a graph showing profiles of the impurity concentrations in the three epitaxial layers 58, 60 and 62 described above as well as of the Ge concentration. As shown in FIG. 9, a phosphorus (P) concentration of approximately $4\times10^{15}$ cm$^{-3}$ is provided in Si epitaxial layer 58 that becomes the upper layer of the collector. In addition, a boron (B) concentration of approximately $10^{18}$ to $10^{19}$ cm$^{-3}$ and a boron (B) concentration of approximately $5\times10^{17}$ cm$^{-3}$, respectively, are provided to SiGe epitaxial layer 60, which becomes the base, and Si epitaxial layer 62, which becomes the emitter. The Ge concentration of SiGe epitaxial layer 60 is set at a maximum of 4% to 30% at the interface portion with Si epitaxial layer 58 and is adjusted to have a profile wherein the concentration gradually becomes lower from the collector side toward the emitter side.

Figure 10:
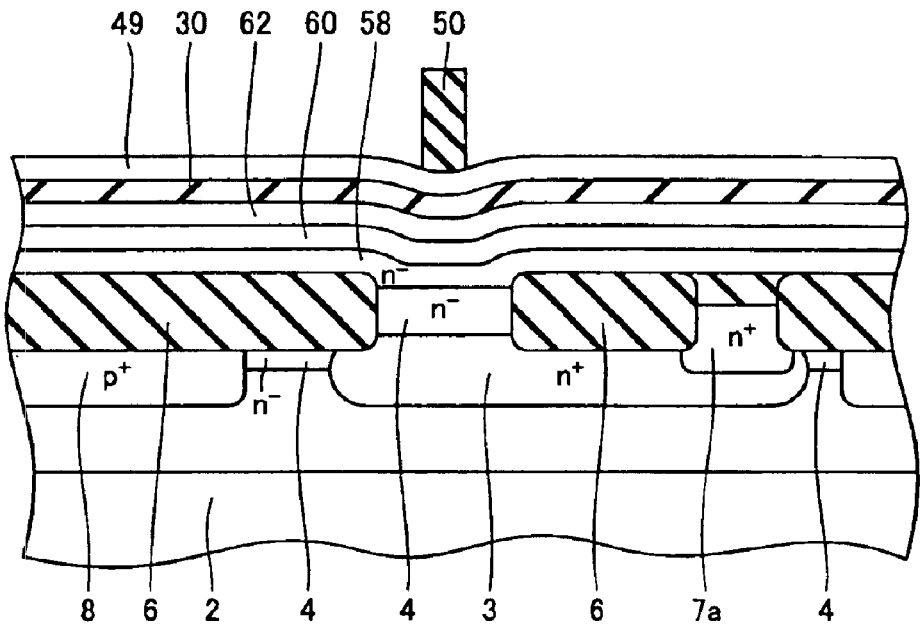
FIG. 10 is a cross sectional view of a stage wherein an oxide film covers a region including the base.

An oxide film 30, a polycrystal silicon film 49 and an oxide film 50 are deposited, from below, in this order, above epitaxial layer 62 starting from the stage of FIG. 8 and oxide film 50 is patterned so as to cover only a region in which an intrinsic base layer is to be formed (FIG. 10).

In this condition, impurities of the p conductive type, such as B, are implanted into the entirety of the wafer. Oxide film 50 is scaled down to a predetermined size, concretely, the size of the emitter layer formed on the intrinsic base layer, by means of isotropic etching, such as wet etching. Next, a predetermined heat treatment is carried out on the semiconductor wafer and, thereby, impurities that have been introduced in three epitaxial layers 58, 60 and 62 are diffused so that a diffusion layer of the p conductive type is formed.

Figure 11:
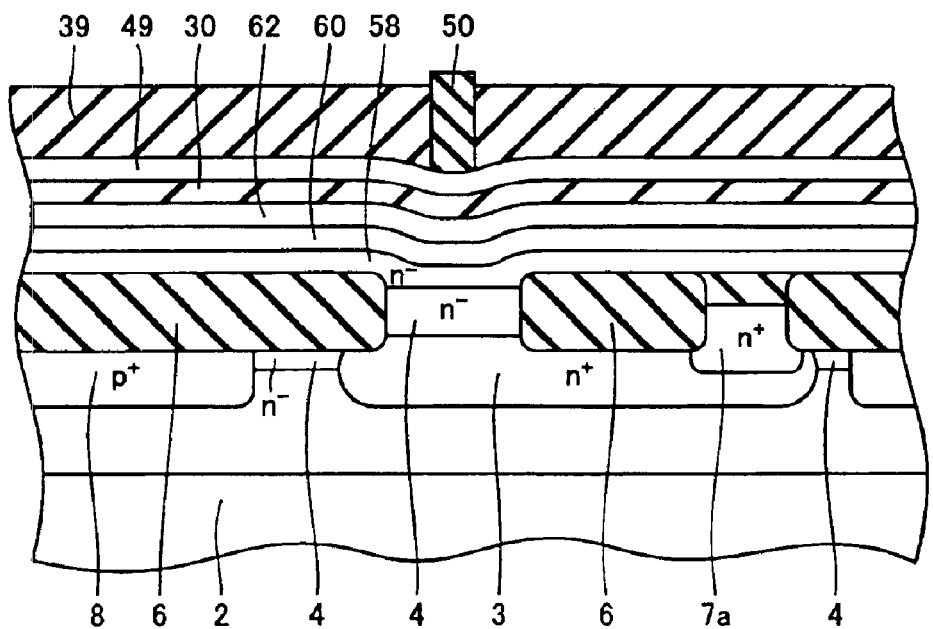
FIG. 11 is a cross sectional view of a stage wherein a photoresist has been formed.
Figure 12:
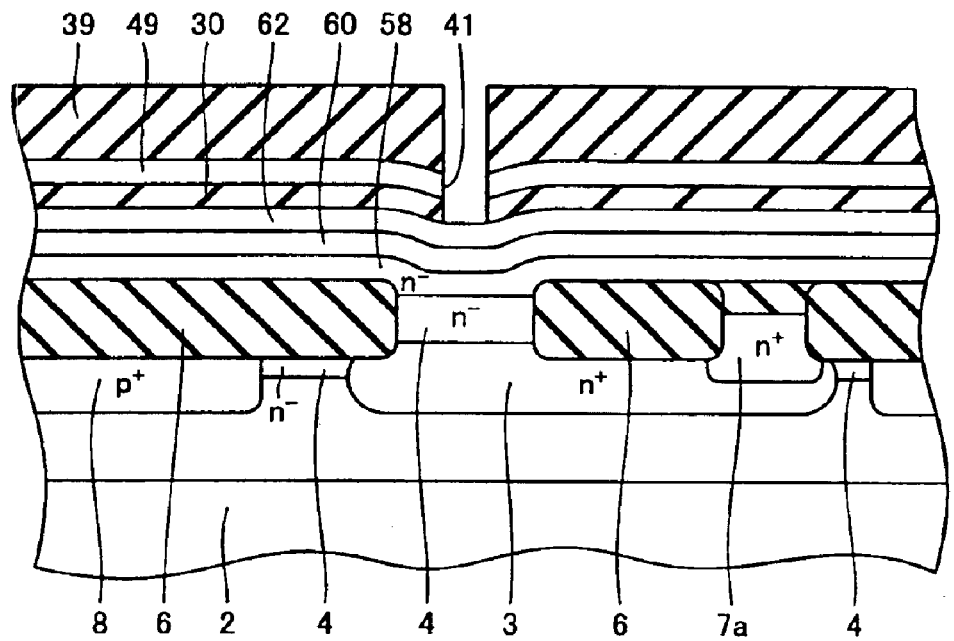
FIG. 12 is a cross sectional view of a stage wherein an oxide film, a polycrystal silicon and the oxide film located above the base are removed using the photoresist as a mask.

Next, a photoresist 39 is applied to the entirety of the surface of the semiconductor wafer and etching back is carried out until the top edge of oxide film 50 is exposed (FIG. 11). Next, as shown in FIG. 12, oxide film 50 remaining in photoresist 39 is removed through etching. Next, polycrystal silicon film 49 and oxide film 30 are etched by using photoresist 39 as a mask and, thereby, an opening 41 is provided in a portion wherein the emitter layer is to be formed. According to the above described process, opening 41 is created in approximately the center of the base in a self-aligned manner. Therefore, a shift between the base and opening 41 can be sufficiently restricted.

Figure 13:
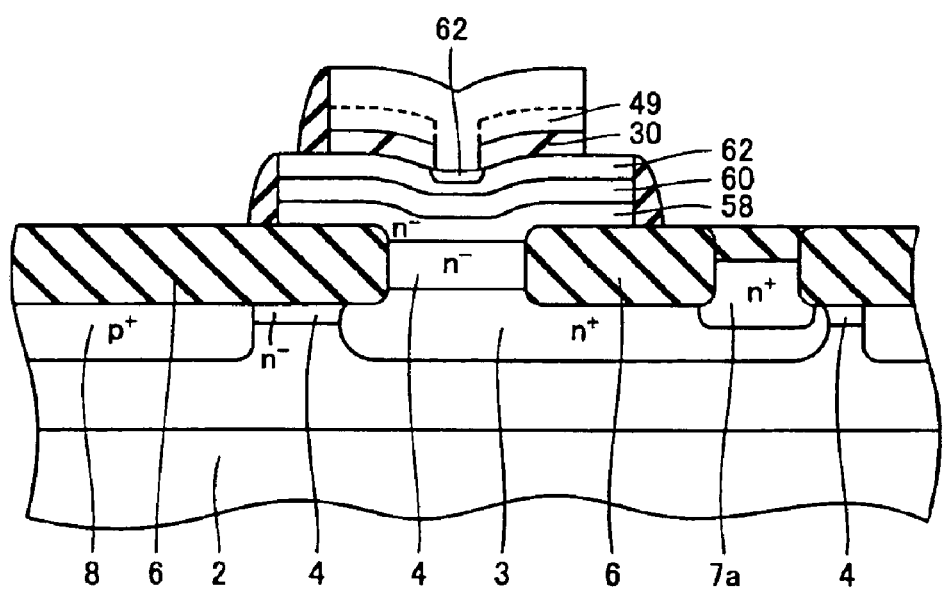
FIG. 13 is a cross sectional view of a stage wherein an emitter has been formed.

Next, after the removal of photoresist 39, an upper layer polycrystal silicon film is deposited over polycrystal silicon film 49 and, then, an implantation process of impurities of an n conductive type, such as As, is carried out. Next, a predetermined heat treatment is carried out on the semiconductor wafer and, thereby, impurities As included in the upper layer polycrystal silicon film are diffused into Si epitaxial film 62 located below the upper layer polycrystal silicon film so that emitter layer 62 is formed in approximately the center of the base. Next, the upper layer polycrystal silicon film, polycrystal silicon film 49 and oxide film 30 are patterned in the form of the emitter electrode using a photoresist as a mask (FIG. 13). A base leading electrode (not shown) is connected to Si epitaxial film 62 located so as to flank the emitter electrode in the center portion. In addition, a collector leading electrode (not shown) is connected to n+ conductive layer 7a on the right.

Hereinafter, cobalt silicide films 18 are formed on the emitter electrode, the base leading electrode and the collector leading electrode in the same manner as in the first embodiment. The process hereinafter is the same as in the first embodiment so that the semiconductor device can be manufactured.

According to a semiconductor device of the present embodiment, the base is formed of SiGe so that noise resistance can be increased in an HBT that allows a high speed operation and the high resistance substrate allows the reduction of loss and the enhancement of the Q value of a passive circuit element.

(Third Embodiment)

Figure 14:
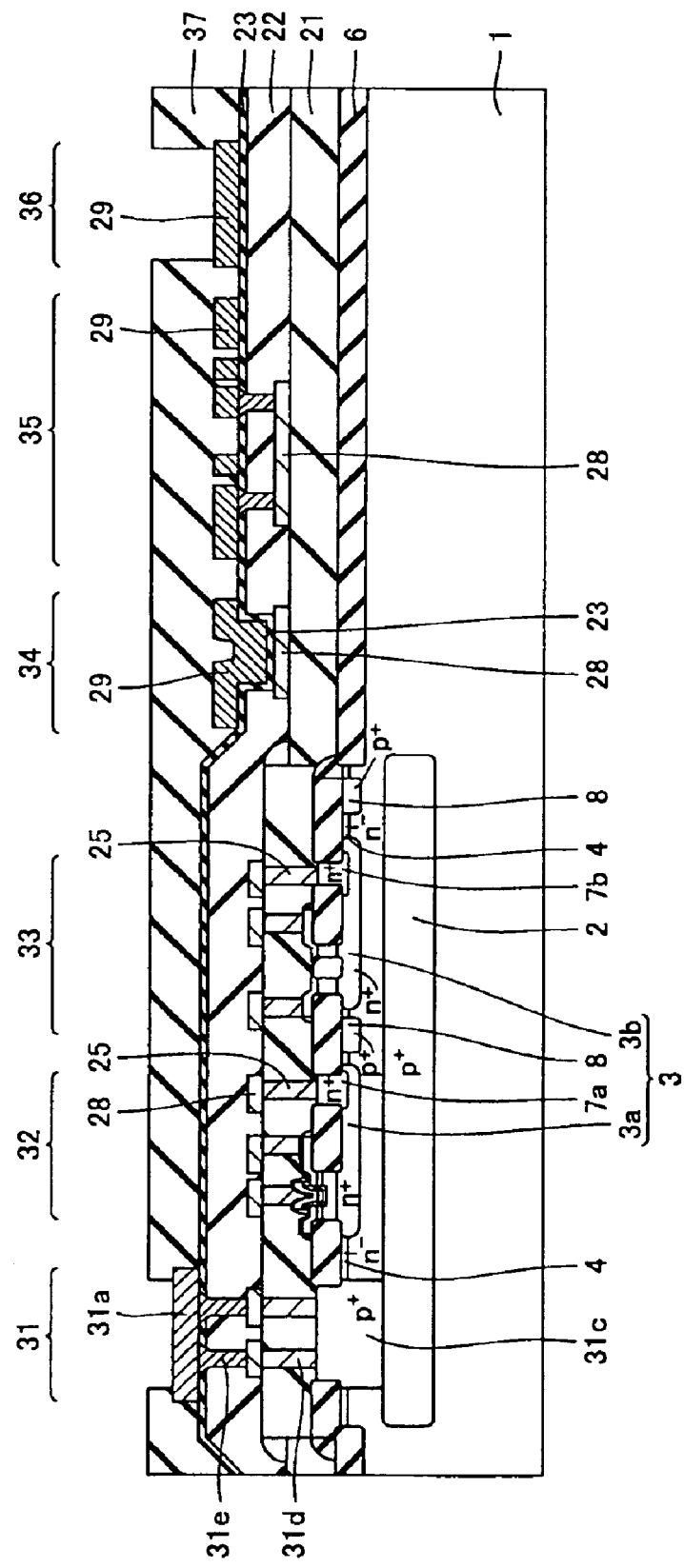
FIG. 14 is a cross sectional view showing a configuration of a semiconductor device according to a third embodiment of the present invention.

In reference to FIG. 14, the third embodiment has a structure wherein a contact of a buried layer 2 of a p conductive type or of a substrate 1 is formed of a layer 31c of a p+ conductive type, formed in an Si substrate and in an epitaxial layer 4 of an n− conductive type, a tungsten (W) plug 31d electrically connected to this layer of the p+ conductive type and an Al wire 31e connected to this W plug. The W plug may be separated into a plurality of pieces or may have a layered structure.

Figure 15:
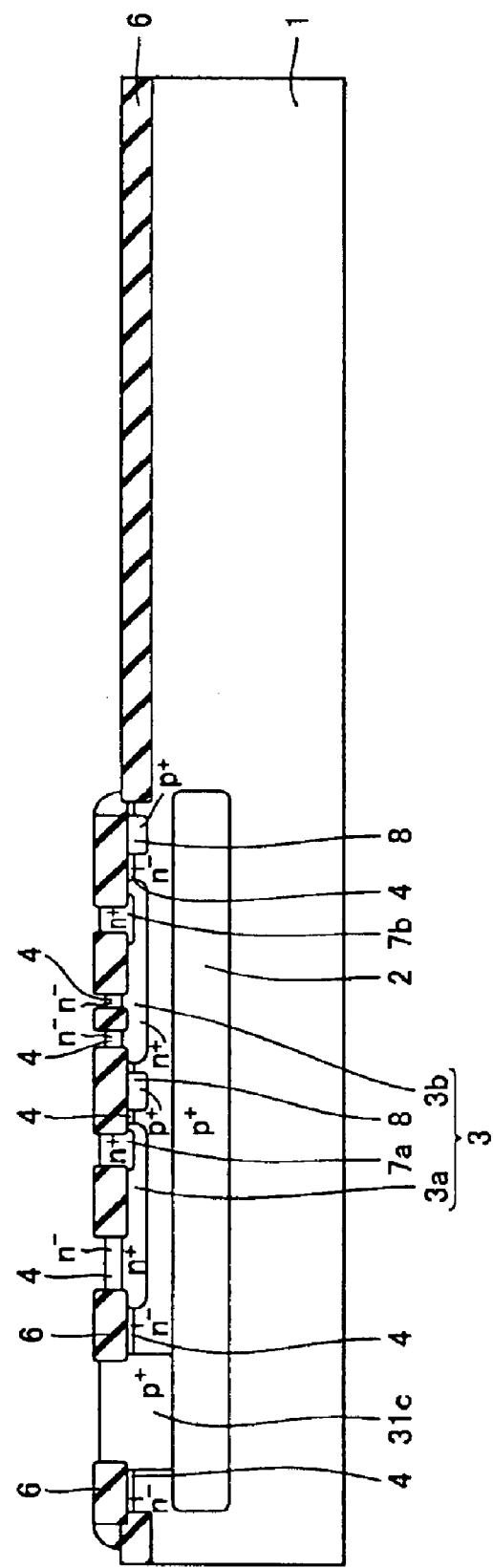
FIG. 15 is a cross sectional view of a stage wherein a p+ type layer has been formed at a bottom portion of a leading electrode of a buried conductive layer drain region in the manufacturing of the semiconductor device of FIG. 14.

The above described structure is formed as follows. As the next stage after the process of FIG. 2, as shown in FIG. 15, impurities of a p conductive type are implanted into the opening for a leading electrode provided in an element isolation insulating film 6 so that region 31c of the p+ conductive type is formed. This region of the p+ conductive type is formed so as to be electrically connected to buried layer 2 of the p+ conductive type. After this, the process steps of FIG. 3, and after, in the first embodiment are carried out as manufacturing steps so that the semiconductor device shown in FIG. 14 is completed.

The same effects as in the first embodiment can be obtained in the present embodiment. Furthermore, it is not necessary to form a deep opening in order to lead out an electrode from the buried layer of the p conductive type by forming the W plug through layering and, therefore, etching can be easily carried out. In addition, a step between a pad portion and the element is small in comparison with the first embodiment and, therefore, the AlCu wires do not cover a large step. Therefore, the risk of wire disconnection can be reduced.

(Fourth Embodiment)

Figure 16:
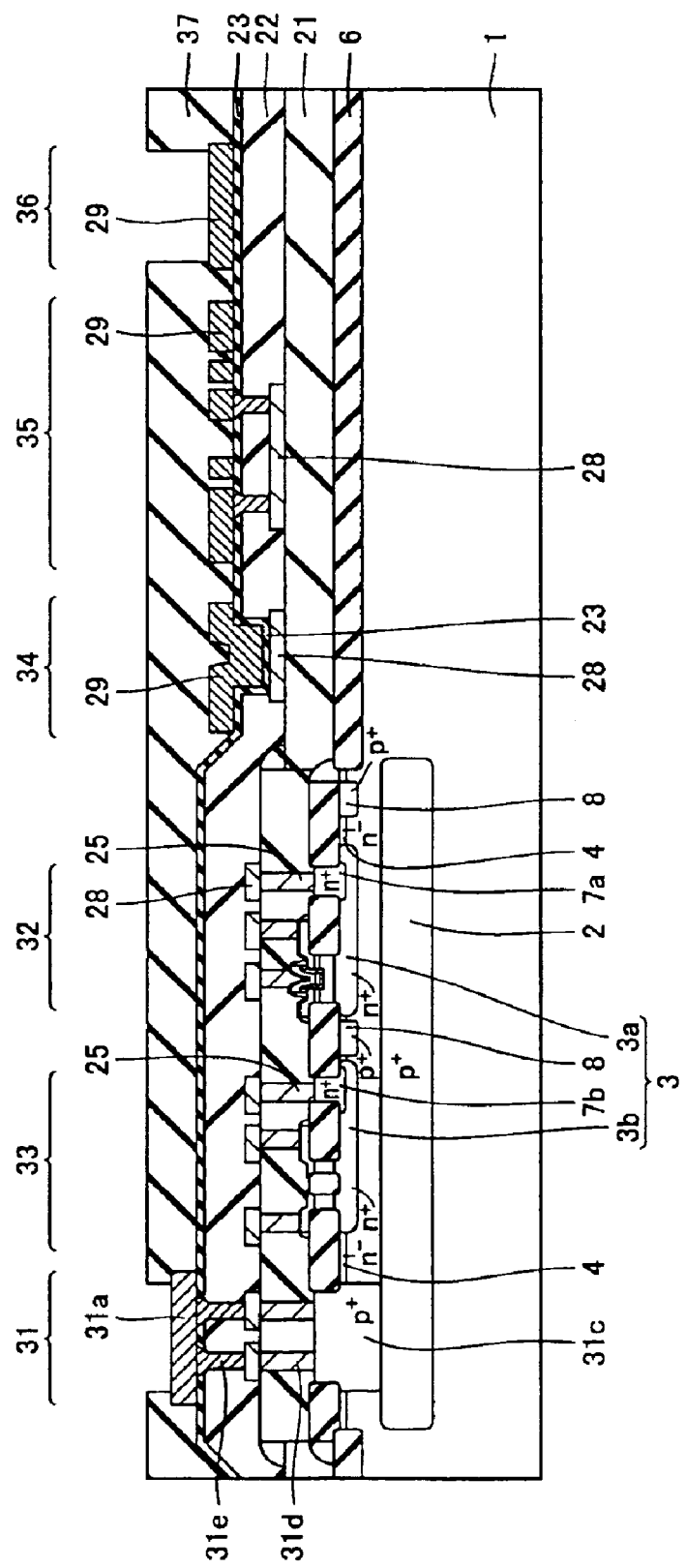
FIGS. 16, 17, 18, and 19 are cross sectional views showing configurations of semiconductor devices according to fourth, fifth, sixth, and seventh embodiments of the present invention, respectively.

The present embodiment is characterized by the point that a buried layer 2 of a p conductive type is formed beneath a portion of the active elements, alone, that is to say, beneath a horizontal pnp transistor 33, alone, in the case of FIG. 16. As for the above described buried layer 2 of the p conductive type, two, or more, of the same type of layers can be provided in one semiconductor device. In addition, though it is provided beneath horizontal pnp transistor 33, alone, in FIG. 16, it can be provided beneath a vertical npn transistor 32, alone. In this case, it is not necessary to remove the n− epitaxial layer.

According to the above described configuration, the effects in the first embodiment can be secured and, in addition, the buried conductive layer can be used beneath a transistor, alone, that is specifically desired to be isolated from other elements from the point of view of noise.

(Fifth Embodiment)

Figure 17:
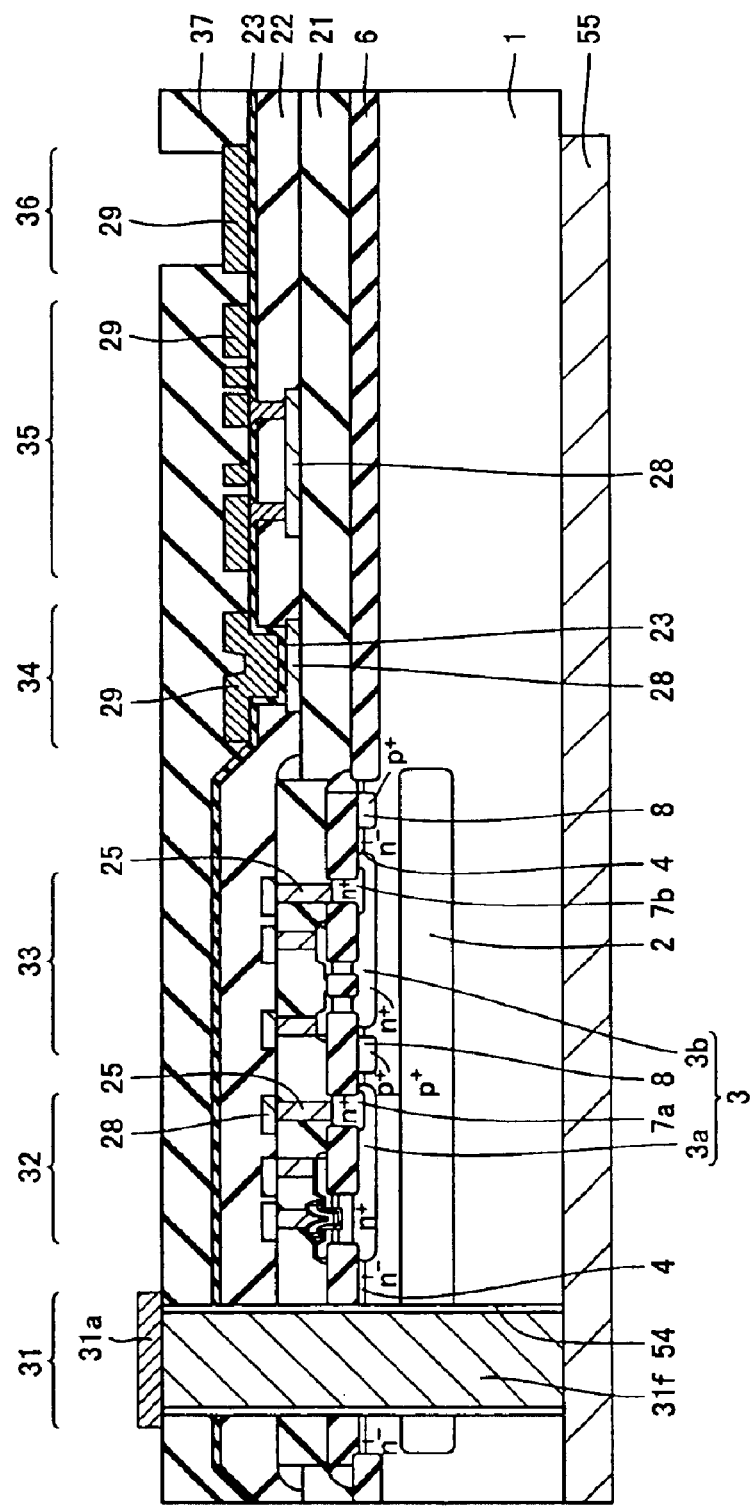

In reference to FIG. 17, the fifth embodiment is characterized by the point that a structure for electrically connecting a leading electrode, a buried layer 2 of a second conductive type and a back plate 55 is provided in an Si substrate. The structure for making a connection with this back plate is formed as follows.

(1) First, a protective film is formed on the surface of a substrate wherein the steps up to the formation of a passivation film 37 are completed and a through hole 54 is created in the substrate by means of a laser, or the like.

(2) Next, a polycrystal silicon including impurities of a p conductive type is deposited and the polycrystal silicon in the portions other than in the connection hole is selectively removed.

(3) After this, a conductive plug 3 if is formed by depositing a metal for forming an ohmic contact, such as Ti, Ni or Au. Conductive plug 31f made of such a metal deposited film allows back plate 55 and the above described conductive plug 31f to be electrically connected to each other.

According to the present embodiment, in addition to the effects of the first embodiment, electrical connection with the back plate can be formed over a short distance in comparison with the case wherein a wire is provided outside of the substrate. Furthermore, the back plate and the buried conductive layer can be provided with the same potential and, thereby, the effects of noise are not easily received from the surroundings.

(Sixth Embodiment)

Figure 18:
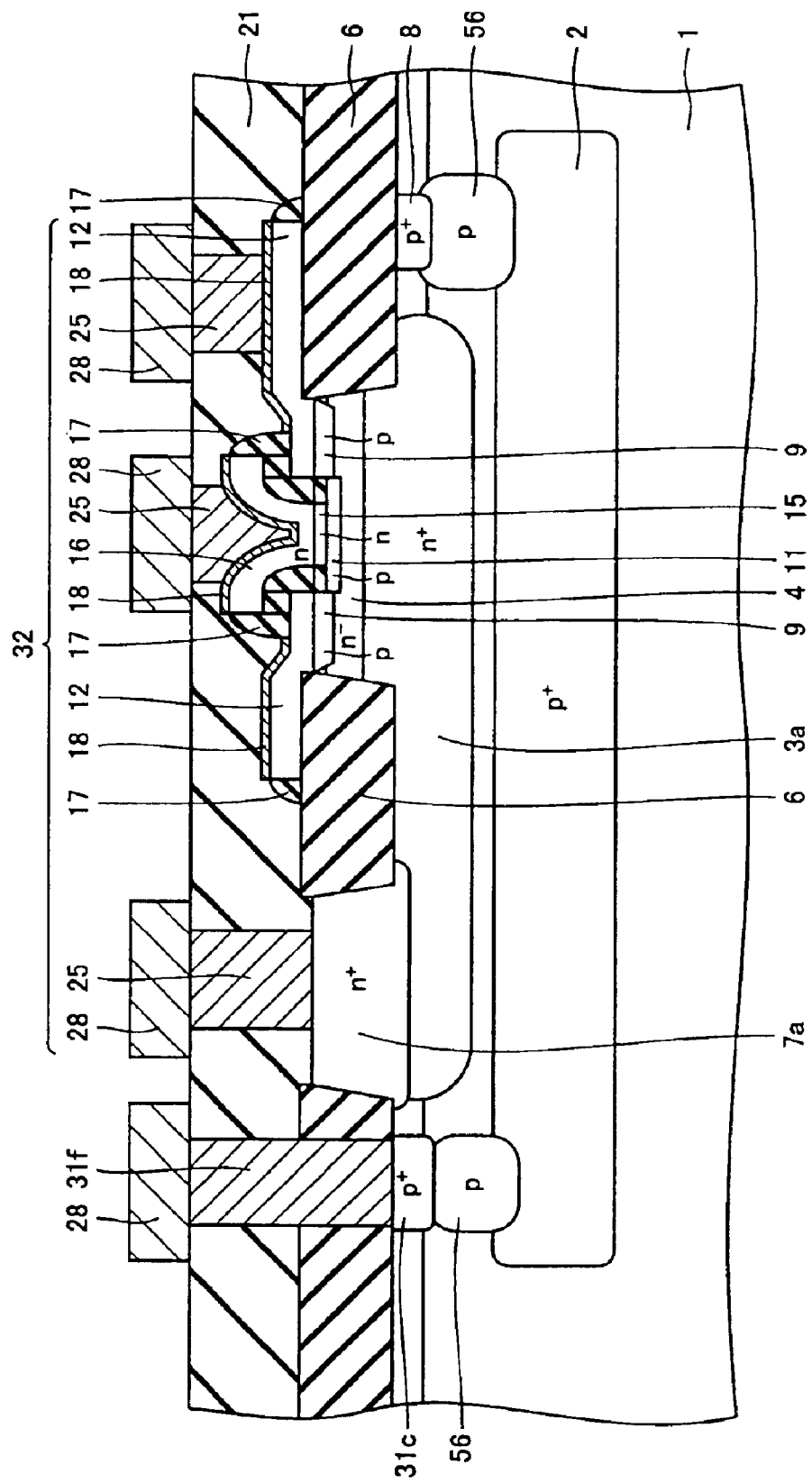

In reference to FIG. 18, only vertical npn transistor 32 in which buried conductive layer 2 is arranged is focused on in the following description. In FIG. 18, the present embodiment is characterized in the point that a buried coupling part 56 of the second conductive type for electrically and regionally coupling a buried layer 8 of a p+ conductive type for element isolation in order to isolate the above described vertical npn transistor from other elements with the above described buried conductive layer 2 is provided. In addition, a layer 31f of the p+ conductive type arranged at a bottom portion of the contact for a leading electrode can also be used as this buried coupling part 56 of the second conductive type.

According to the semiconductor device of the present embodiment, the potential of buried coupling part 56 can be fixed and, therefore, it becomes easy to block noise vis-a-vis the adjoining elements. In addition, the space that the device takes up can be reduced by using a p+ conductive layer between contacts as a buried p+ conductive layer.

(Seventh Embodiment)

Figure 19:
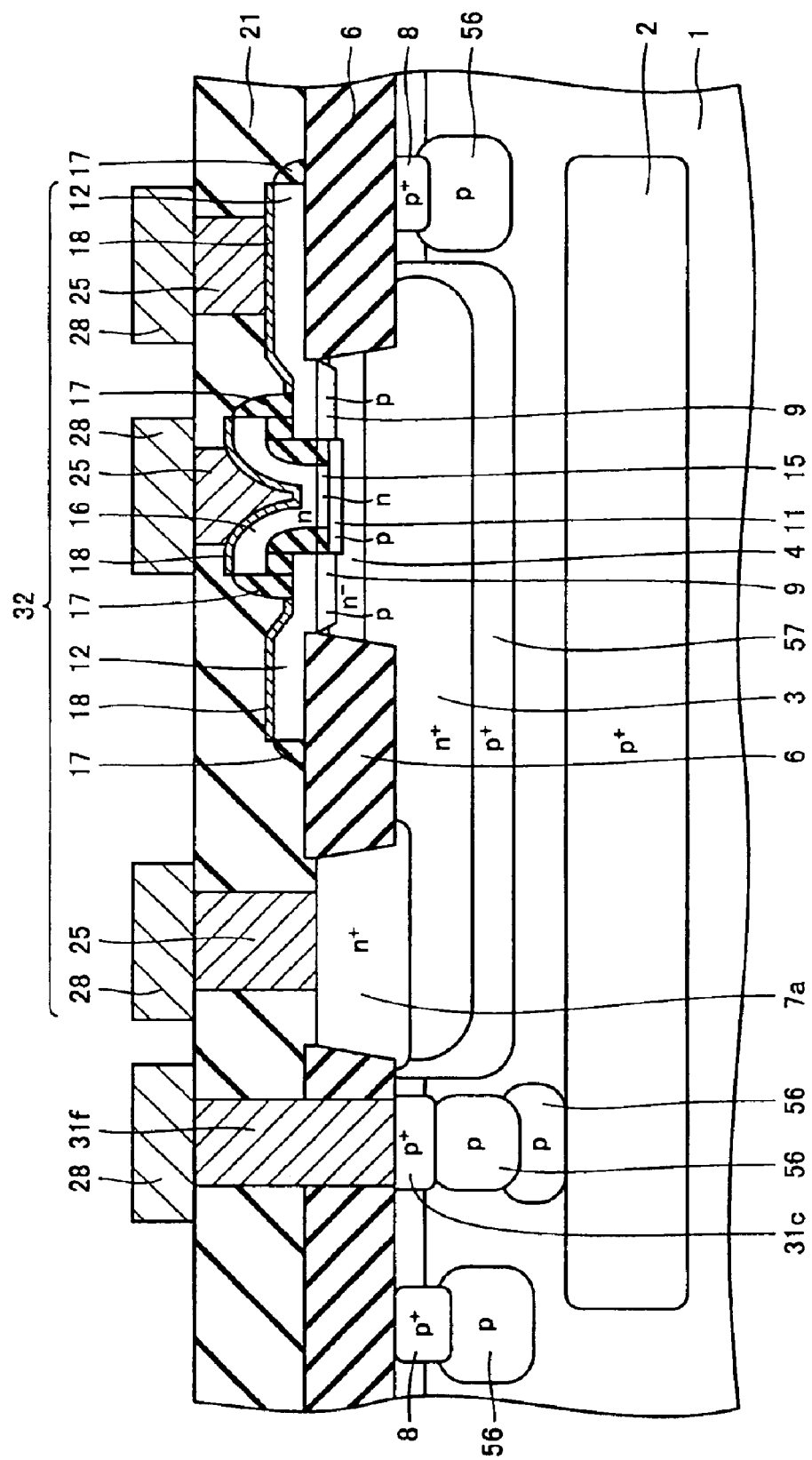

In reference to FIG. 19, the seventh embodiment is characterized by the point that an encircling layer 57 of the p+ conductive type is provided directly beneath a buried collector layer 3 of the n+ conductive type so as to contact the buried collector layer 3 of the n+ conductive type. According to this configuration, the potential barrier can be arranged so as to surround buried collector layer 3 of the n+ conductive type and, therefore, the effect of the prevention of punch through between elements can be enhanced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including:
   a semiconductor substrate having a first resistivity;
   a bipolar transistor in said semiconductor substrate at a region of a main surface of said semiconductor substrate, wherein said bipolar transistor includes a semiconductor region of a first conductivity type, having a second resistivity, at a portion of said bipolar transistor that is deepest in said semiconductor substrate;
   a buried region of a second conductivity type, having a third resistivity, and located within said semiconductor substrate, wherein
      the second and third resistivities are smaller than the first resistivity, and
      a portion of said semiconductor substrate having the first resistivity, higher than the second and third resistivities, is interposed between said buried region of the second conductivity type and said semiconductor region of the first conductivity type of said bipolar transistor; and
   a back plate on a rear surface of said semiconductor substrate and a connection part in said semiconductor substrate electrically connecting said buried region of the second conductivity type to said back plate, said back plate extending across the rear surface of said semiconductor substrate opposite said buried region of the second conductivity type.

2. A semiconductor device including;
   a semiconductor substrate having a first resistivity;
   a first bipolar transistor in said semiconductor substrate, wherein said first bipolar transistor includes
      a first semiconductor region of a first conductivity type located in said semiconductor substrate and a first semiconductor layer of the first conductivity type in contact with said first semiconductor region,
      an insulating film located at least partially in said first semiconductor region and extending beyond said first semiconductor layer on said semiconductor substrate, said insulating film having an opening providing access to said first semiconductor layer,
      a second semiconductor layer of the second conductivity type located on at least part of said first semiconductor layer and contacting said first semiconductor layer within the opening in said insulating film, and
      a third semiconductor layer of the first conductivity type located on and contacting said second semiconductor layer within the opening in said insulating film;
   a buried region of the second conductivity type located within said semiconductor substrate wherein all of said first semiconductor region of the first conductivity type, said first semiconductor layer of the first conductivity type, said second semiconductor layer of the second conductivity type, and said third semiconductor layer of the first conductivity type have resistivities smaller than the first resistivity of said semiconductor substrate, and a portion of said semiconductor substrate having the first resistivity, higher than the resistivities of said first semiconductor region, said first semiconductor layer, said second semiconductor layer, and said third semiconductor layer, is interposed between said buried region of the second conductivity type and said first semiconductor region of said bipolar transistor; and
   a back plate on a rear surface of said semiconductor substrate and a connection part in said semiconductor substrate electrically connecting said buried region of the second conductivity type to said back plate, said back plate extending across the rear surface of said semiconductor substrate opposite said buried region of the second conductivity type.

3. A semiconductor device comprising:
   a semiconductor substrate having a first resistivity;
   a bipolar transistor in said semiconductor substrate at a region of a main surface of said semiconductor substrate, wherein said bipolar transistor includes a semiconductor region of a first conductivity type, having a second resistivity, at a portion of said bipolar transistor that is deepest in said semiconductor substrate;
   a buried region of a second conductivity type, having a third resistivity, and located within said semiconductor substrate, wherein
      the second and third resistivities are smaller than the first resistivity, and
      a portion of said semiconductor substrate having the first resistivity, higher than the second and third resistivities, is interposed between said buried region of the second conductivity type and said semiconductor region of the first conductivity type of said bipolar transistor; and
   a second bipolar transistor in said semiconductor substrate, wherein said second bipolar transistor includes a second semiconductor region of the first conductivity type at a portion of said second bipolar transistor deepest in said semiconductor substrate, and said buried region of the second conductivity type extends within said semiconductor substrate to a position directly opposite and facing said second semiconductor region of the first conductivity type of said second bipolar transistor.

4. The semiconductor device according to claim 2, wherein the first resistivity is no less than 100 Ωcm.

5. The semiconductor device according to claim 2, further comprising a leading electrode electrically connected to said buried region of the second conductivity type.

6. The semiconductor device according to claim 2, wherein said semiconductor substrate is a silicon substrate and SiGe is included in, at least, a base region of said bipolar transistor.

7. The semiconductor device according to claim 2, further comprising an element isolation region of the second conductivity type in said semiconductor substrate surrounding said bipolar transistor in a plan view of said semiconductor substrate, and a coupling region of the second conductivity type coupling said buried region of the second conductivity type to said element isolation region.

8. The semiconductor device according to claim 2, further comprising an encircling region of the second conductivity type in said semiconductor substrate that contacts and surrounds said first semiconductor region of the first conductivity type from a side so that said semiconductor region of the first conductivity type is shielded from part of said semiconductor substrate having the first resistivity.

9. The semiconductor device according to claim 3, wherein the first resistivity is no less than 100 $\Omega$cm.

10. The semiconductor device according to claim 3, further comprising a leading electrode electrically connected to said buried region of the second conductivity type.

11. The semiconductor device according to claim 3, wherein said semiconductor substrate is a silicon substrate and SiGe is included in, at least, a base region of said bipolar transistor.

12. The semiconductor device according to claim 3, further comprising an element isolation region of the second conductivity type in said semiconductor substrate surrounding said bipolar transistor in a plan view of said semiconductor substrate, and a coupling region of the second conductivity type coupling said buried region of the second conductivity type to said element isolation region.

13. The semiconductor device according to claim 3, further comprising an encircling region of the second conductivity type in said semiconductor substrate that contacts and surrounds said first semiconductor region of the first conductivity type from a side so that said semiconductor region of the first conductivity type is shielded from part of said semiconductor substrate having the first resistivity.

* * * * *